US006595404B2

(12) United States Patent
Suzuki et al.

(10) Patent No.: US 6,595,404 B2
(45) Date of Patent: Jul. 22, 2003

(54) METHOD OF PRODUCING ELECTRONIC PART WITH BUMPS AND METHOD OF PRODUCING ELECTRONIC PART

(75) Inventors: Takamichi Suzuki, Yokohama (JP); Yoshihide Yamaguchi, Fujisawa (JP); Noriyuki Oroku, Yokohama (JP); Kosuke Inoue, Fujisawa (JP)

(73) Assignee: Hitachi, Ltd., Tokyo (JP)

( * ) Notice: Subject to any disclaimer, the term of this patent is extended or adjusted under 35 U.S.C. 154(b) by 312 days.

(21) Appl. No.: 09/758,182

(22) Filed: Jan. 12, 2001

(65) Prior Publication Data

US 2001/0008160 A1 Jul. 19, 2001

(30) Foreign Application Priority Data

Jan. 13, 2000 (JP) ........................................ 2000-010053

(51) Int. Cl.[7] ........................ B23K 31/02; B23K 31/00; B23K 35/12
(52) U.S. Cl. ................ 228/175; 228/179.1; 228/180.22; 228/180.21; 228/245
(58) Field of Search ............................ 228/175, 179.1, 228/180.22, 245, 180.21; 438/610, 618, 613, 106

(56) References Cited

U.S. PATENT DOCUMENTS

| 3,923,571 | A | * | 12/1975 | Aoki et al. ................. 156/230 |
| 5,196,371 | A | * | 3/1993 | Kulesza et al. ............... 29/831 |
| 5,427,303 | A | * | 6/1995 | Nowotarski ............. 228/180.22 |
| 5,843,259 | A | * | 12/1998 | Narang et al. ............... 156/151 |
| 5,879,761 | A | * | 3/1999 | Kulesza et al. ........... 156/272.8 |
| 5,960,251 | A | * | 9/1999 | Brusic et al. ............. 106/14.17 |
| RE36,613 | E | * | 3/2000 | Ball ........................... 257/676 |
| 6,066,551 | A | * | 5/2000 | Satou et al. ................. 438/613 |
| 6,113,728 | A | * | 9/2000 | Tsukagoshi et al. ........ 156/264 |
| 6,158,115 | A | * | 12/2000 | Tsukagoshi et al. .......... 29/825 |
| 6,180,209 | B1 | * | 1/2001 | Sato et al. ................... 428/141 |
| 6,189,208 | B1 | * | 2/2001 | Estes et al. ................. 174/260 |
| 6,207,559 | B1 | * | 3/2001 | Jiang ........................... 438/618 |
| 6,213,386 | B1 | * | 4/2001 | Inoue et al. ................ 228/245 |
| 6,221,692 | B1 | * | 4/2001 | Shoji et al. ................. 438/106 |
| 6,336,262 | B1 | * | 1/2002 | Dalal et al. ............ 228/180.21 |

FOREIGN PATENT DOCUMENTS

| JP | A-9-27498 | 1/1997 |
| JP | A-11-243274 | 9/1999 |

* cited by examiner

*Primary Examiner*—Tom Dunn
*Assistant Examiner*—L. Edmondson
(74) *Attorney, Agent, or Firm*—Antonelli, Terry, Stout & Kraus, LLP

(57) ABSTRACT

Forming solder bumps each having a constant height by surely supplying onto each of electrode pads a solder ball corresponding to a predetermined volume while omitting Au plating performed on the electrode pads onto which the solder bumps are to be formed. For achieving the forming of the solder bumps, the adhesive film is formed instead of the Au plating, the adhesive film being used as an oxidation-preventing film and as film for temporarily fixing each of the solder balls, the solder balls being supplied by stencil mask or the vacuum adsorbing mask.

3 Claims, 6 Drawing Sheets

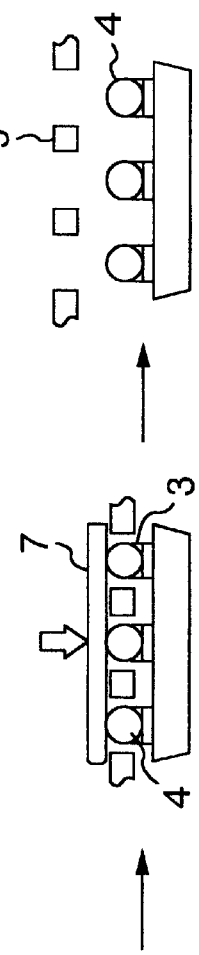
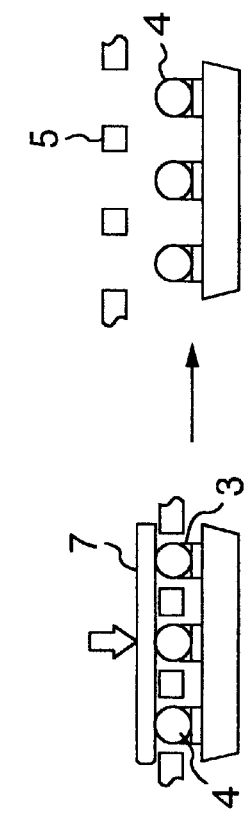
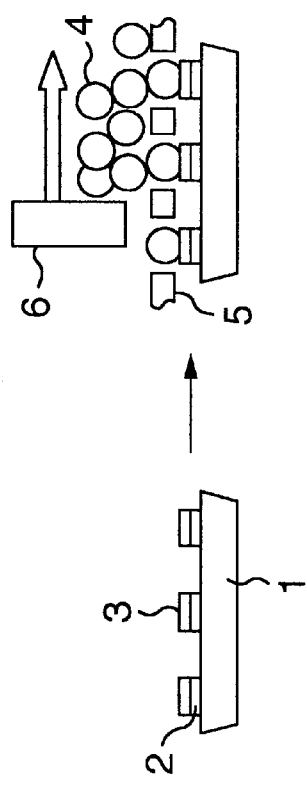
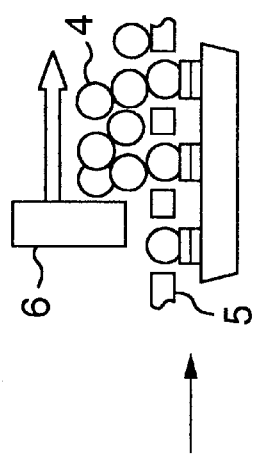
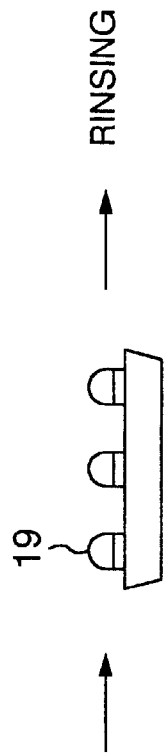
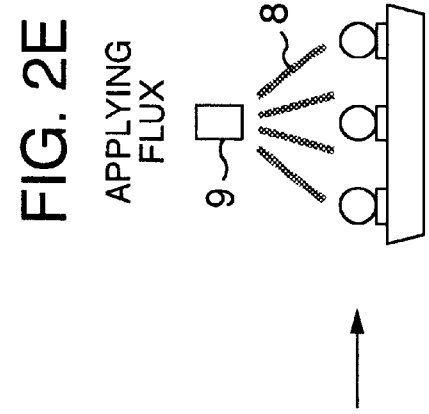

METHOD OF PRODUCING ELECTRONIC PART WITH BUMPS AND METHOD OF PRODUCING ELECTRONIC PART

BACKGROUND OF THE INVENTION

The invention relates to a method of producing an electronic part with bumps, such as a mounting substrate, a semiconductor package, a semiconductor wafer, a semiconductor chip and etc., in which a plurality of conductive bumps for electrical connection are formed, and relates to another method of producing an electronic part in which method a first electronic part with bumps is bonded to a second electronic part such as a substrate.

In recent years, for realizing the high density design of electronic circuit and the high speed design of signal transmission in the electronic circuit, there is adopted a connection system using bumps for connecting a printed board to a semiconductor package.

As regards conventional technique is known JP-A-9-199506 (Conventional Technique 1). Namely, in Conventional Technique 1 there is disclosed a method comprising the steps of: forming nickel film on each of electrode pads provided on a wafer, selectively forming a adhesive film on each of the electrode pads, then excessively supplying solder particles so that some of the solder particles are adhered to the nickel film through the adhesive film, shaking excessive solder particles off the adhesive film by use of brush etc., supplying flux onto each of the solder particles adhered to the adhesive film, and heating and melding the solder particles so that solder bumps may be formed.

As another conventional technique is also known JP-A-6-152120 (Conventional Technique 2). In Conventional Technique 2, solder powder is spread on adhesive film previously formed, and then the reflow thereof is performed so that a thin solder layer such as priming solder may be formed.

However, in the method of Conventional Technique 1, in a case where the size of each of electrode pads is smaller than that of the solder particle, the electrode pad is apt to be located among a plurality of adjacent solder particles with the result that the necessary solder particles do not come to be adhered onto the pads, so that there is such a fear as the failure of bonding is apt to occur. On the other hand, in another case where the size of each of the pad electrodes is equal to or is somewhat larger than that of the solder particle, a plurality of solder particles are apt to be adhered onto the electrode pad, which causes such an unfavorable state as some of resultant solder bumps come to have volume two or three times as large as that of each of normal bumps although each of the resultant bumps must have the same volume each other, so that connection reliability required when a substrate or a board is mounted is deteriorated. Further, the removing of excess solder particles by use of, for example, a brush is apt to remove such solder particles temporarily adhered as to be formed into solder bumps, so that there occurs such a fear as failure in connection is caused.

On the other hand, in the method of Conventional Technique 2, solder powder of particles each sufficiently smaller in size than the size of each of the pads are spread onto each of the pads, and then the reflow of the solder powder is performed, so that the resultant bumps are prevented from having sizes quite different from each other, however, the adhering amount of the solder powder is limited to be not more than the volume of a value multiplying a pad surface area by the height of the solder powder. Thus, in order to obtain solder bumps each having a sufficient volume, the several repetitions of the step are required unfavorably, which is not practical.

SUMMARY OF THE INVENTION

The first object of the invention is to obtain a method of producing an electronic part with bumps which can solve the above problems, in which method one solder ball having a volume corresponding to an intended solder bump volume is surely supplied onto an adhesive portion, whereby even solder bumps each having a large volume can be formed by a single step while preventing the solder bumps from having various volumes different from each other, and the second object of the invention is to obtain another method of producing electronic parts in which method the electronic part with bumps is bonded to another electronic part such as a substrate or board.

In the invention, in order to achieve the object of the invention, adhesive film is selectively formed on electrode pads of a semiconductor device or on electrode pads each formed by metallizing with, for example, Ni on metal conductor of the semiconductor device, a solder preform having a predetermined volume being then supplied onto the adhesive film formed on each of the pads through a stencil mask or an adsorption mask so that the solder preform may be adhered to the adhesive film regarding each of the pads, and the reflow of the solder preforms is performed, after coating the preforms with flux as occasion demands, so that a solder bump having a predetermined volume may be formed on each of the electrode pads.

Namely, according to the first aspect of the invention, there is provided a method of producing an electronic part with bumps, comprising: selectively forming an adhesive film on each of a plurality of pad portions provided on the electronic component; aligning and supplying a bonding member onto each of the adhesive films; and bonding each of the bonding members to each of the pad portions by melting the bonding member so that each of the bumps is formed on each of the pad portions.

According to the second aspect of the invention, there is provided a method of producing on electronic part with bumps, comprising the steps of:

selectively forming adhesive film on each of a plurality of pad portions provided on said electronic component, which forming is performed by immersing the electronic component in a fluid containing imidazole derivative which is adsorbed on metallic portions and which is not adsorbed on portions other than the metallic portions;

aligning and supplying a bonding member onto said adhesive film formed on each of said pad portions; and bonding each of said bonding members to each of said pad portions by melting said bonding member so that each of said bumps is formed of said bonding member and so that each of said bumps is bonded to each of said pad portions.

A method of producing an electronic part with bumps according to the first aspect of the invention, wherein the thickness of the adhesive film is made to be not less than 5 μm in the adhesive film-forming step.

According to the third aspect of the invention, there is provided a method of producing an electronic part with bumps, comprising the steps of:

selectively forming adhesive film on each of a plurality of pad portions provided on said electronic component, which forming is performed by immersing the electronic component in a fluid containing imidazole derivative which is adsorbed on metallic portions and which is not adsorbed on portions other than the metallic portions;

aligning and supplying a bonding member onto said adhesive film formed on each of said pad portions, which aligning and supplying are performed by use of both of an aligning mask having opening portions capable of aligning and supplying said bonding members and an aligning squeegee capable of moving the bonding members into said opening portions; and bonding each of said bonding members, which are supplied in the bonding member-aligning-and-supplying step, to each of said pad portions by melting said bonding member so that each of said bumps is formed of said bonding member and so that each of said bumps is bonded to each of said pad portions.

According to the fourth aspect of the invention, there is provided a method of producing electronic circuit, comprising the steps of:

selectively forming adhesive film on each of a plurality of pad portions provided on a first electronic part;

aligning and supplying a bonding member to said adhesive film formed on each of said pad portions in said adhesive film-forming step;

relatively aligning each of said pad portions of the first electronic part, each of which pad portions is provided with said bonding member supplied in the bonding member-aligning-and-supplying step, to each of pad portions of a second electronic part, and then overlapping each of said pad portions of the first electronic part with each of said pad portions of the second electronic part through the bonding member interposed therebetween; and bonding said overlapped pad portions of said first electronic part to said overlapped pad portions of said second electronic part by melting said bonding members so that an electric circuit of said first electronic part is bonded to another electric circuit of said second electronic part.

According to the fifth aspect of the invention, there is provided a method of producing electronic circuit, comprising the steps of:

selectively forming adhesive film on each of a plurality of pad portions provided on a first electronic part, which forming is performed by immersing the electronic component in a fluid containing imidazole derivative which is adsorbed on metallic portions and which is not adsorbed on portions other than the metallic portions;

aligning and supplying a bonding member to said adhesive film formed on each of said pad portions in said adhesive film-forming step;

relatively aligning each of said pad portions of the first electronic part, each of which pad portions is provided with said bonding member supplied in the bonding member-aligning-and-supplying step, to each of pad portions of a second electronic part, and then overlapping each of said pad portions of the first electronic part with each of said pad portions of the second electronic part through the bonding member interposed therebetween; and bonding said overlapped pad portions of said first electronic part to said overlapped pad portions of said second electronic part by melting said bonding members so that an electric circuit of said first electronic part is bonded to another electric circuit of said second electronic part.

According to the sixth aspect of the invention, there is provided a method of producing electronic circuit, comprising the steps of:

selectively forming adhesive film on each of a plurality of pad portions provided on a first electronic part, which forming is performed by immersing the electronic component in a fluid containing imidazole derivative which is adsorbed on metallic portions and which is not adsorbed on portions other than the metallic portions;

aligning and supplying a bonding member to said adhesive film formed on each of said pad portions in said adhesive film-forming step, which aligning and supplying are performed by use of both of an aligning mask having opening portions capable of aligning and supplying said bonding members and an aligning squeegee capable of moving the bonding members into said opening portions;

relatively aligning each of said pad portions of the first electronic part, each of which pad portions is provided with said bonding member supplied in the bonding member-aligning-and-supplying step, to each of pad portions of a second electronic part, and then overlapping each of said pad portions of the first electronic part with each of said pad portions of the second electronic part through the bonding member interposed therebetween; and bonding said overlapped pad portions of said first electronic part to said overlapped pad portions of said second electronic part by melting said bonding members so that an electric circuit of said first electronic part is bonded to another electric circuit of said second electronic part.

According to the seventh aspect of the invention, there is provided a method of producing electronic circuit, comprising the steps of:

selectively forming adhesive film on each of a plurality of pad portions provided on a first electronic part, which forming is performed by immersing the electronic component in a fluid containing imidazole derivative which is adsorbed on metallic portions and which is not adsorbed on portions other than the metallic portions;

aligning and supplying a bonding member to said adhesive film formed on each of said pad portions in said adhesive film-forming step, which aligning and supplying are performed by use of both of an aligning mask having opening portions capable of aligning and supplying said bonding members and an aligning squeegee capable of moving the bonding members into said opening portions;

relatively aligning each of said pad portions of the first electronic part, each of which pad portions is provided with said bonding member supplied in the bonding member-aligning-and-supplying step, to each of pad portions of a second electronic part, and then overlapping each of said pad portions of the first electronic part with each of said pad portions of the second electronic part through the bonding member interposed therebetween; and bonding said overlapped pad portions of said first electronic part to said overlapped pad portions of said second electronic part by melting said bonding members so that an electric circuit of said first electronic part is bonded to another electric circuit of said second electronic part.

According to the eighth aspect of the invention, there is provided a method of producing electronic circuit, comprising the steps of:

selectively forming adhesive film on each of a plurality of pad portions provided on a first electronic part, which forming is performed by immersing said first electronic component in a fluid containing imidazole derivative which is adsorbed on metallic portions and which is not adsorbed on portions other than the metallic portions;

selectively forming adhesive film on each of a plurality of pad portions provided on a second electronic part, which forming is performed by immersing said first electronic component in said fluid;

aligning and supplying a bonding member to said adhesive film formed on each of said pad portions in the first adhesive-film-forming step;

relatively aligning each of the pad portions of the first electronic part, each of which pad portions is provided with a bonding member supplied in the bonding member-aligning-and-supplying step, to each of pad portions of a second electronic part, and then overlapping each of said pad portions of the first electronic part with each of said pad portions of the second electronic part through the bonding member interposed therebetween; and bonding said overlapped pad portions of the first electronic part to said overlapped pad portions of the second electronic part by melting said bonding members so that an electric circuit of the first electronic part is bonded to another electric circuit of the second electronic part.

According to the ninth aspect of the invention, there is provided a method of producing electronic circuit, comprising the steps of:

selectively forming adhesive film on each of a plurality of pad portions provided on a first electronic part, which forming is performed by immersing said first electronic component in a fluid containing imidazole derivative which is adsorbed on metallic portions and which is not adsorbed on portions other than the metallic portions;

selectively forming adhesive film on each of a plurality of pad portions provided on a second electronic part, which forming is performed by immersing said first electronic component in said fluid;

aligning and supplying a bonding member to said adhesive film formed on each of said pad portions in the first adhesive-film-forming step, which aligning and supplying are performed by use of both of an aligning mask having opening portions capable of aligning and supplying said bonding members and an aligning squeegee capable of moving the bonding members into said opening portions;

relatively aligning each of the pad portions of the first electronic part, each of which pad portions is provided with said bonding member supplied in the bonding member-aligning-and-supplying step, to each of pad portions of a second electronic part, and then overlapping each of said pad portions of the first electronic part with each of said pad portions of the second electronic part through the bonding member interposed therebetween; and bonding said overlapped pad portions of the first electronic part to said overlapped pad portions of the second electronic part by melting said bonding members so that an electric circuit of the first electronic part is bonded to another electric circuit of the second electronic part.

In the methods, it is preferred that the thickness of the adhesive film be made to be not less than 5 $\mu$m. Further, each of the methods may comprise a step of regenerating the adhesive film having been already formed in the adhesive film-forming step so that the adhesive film may have adhesion.

BRIEF DESCRIPTION OF THE DRAWINGS

FIGS. 2A to 2G are drawings for explaining an embodiment of a method of forming the bumps relating to the invention.

DETAILED DESCRIPTION OF THE PREFERRED EMBODIMENTS

By use of the drawings are explained a method of producing an electronic part with bumps and another method of producing an electronic part in which the electronic part with bumps is connected to another electronic part such as a substrate etc.

Figure 1:
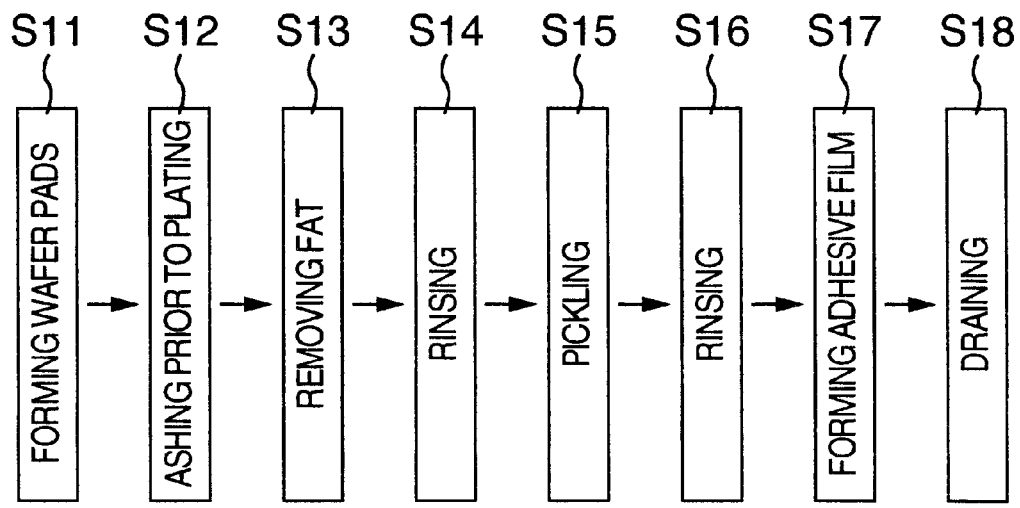
FIG. 1 is a drawing for explaining an embodiment of a method of forming the adhesive film relating to the invention.
Figure 3:
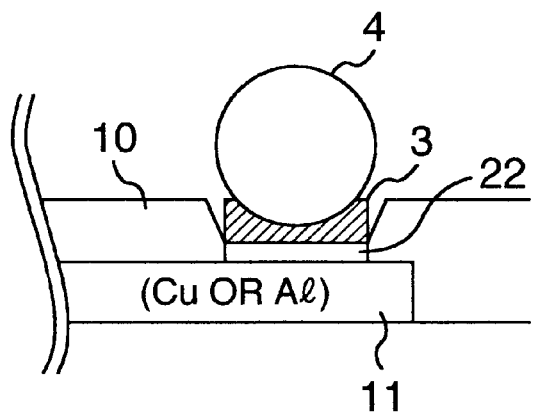
FIG. 3 is a drawing showing a sectional shape of the solder bonding portion relating to the invention.

In FIG. 1 there are shown steps for forming adhesive films 3 relating to the first embodiment of the invention. In FIG. 2 are shown steps of forming bumps 19. A wafer 1 is transferred from a wafer pad-forming step S11 to an adhesive-film-forming step S17. Between the steps S11 and S17, the wafer is subjected to: an ashing treatment step prior to plating S12 which ashing treatment S12 is performed to remove organic substances; a fat-removing step S13 for removing fat; a rinsing step S14 for washing the wafer with water; and a pickling step S15 for pickling the wafer. In the adhesive-forming step S17, the adhesive film 3 is formed on each of connection pads 2 provided on the wafer 1 which is an electronic part, and then in a draining step S18 the wafer is drained, whereby the adhesive film 3 is formed. In this case, it is possible to omit either of the ashing step S12 and the fat-removing step S13 according to the surface cleanness of the wafer pads, and there may be such a case as to omit both of the ashing step S12 and the fat-removing step S13 by optimizing the conditions of the pickling step S15 performed after the fat-removing step. Thus, after the wafer pad-forming step S11, the wafer is transferred to the adhesive film-forming step while the good surface cleanness is kept, and then the adhesive film having a thickness of not less than about 5 µm is formed as shown in FIG. 3. Since the Ni film 22 is prevented, because of the adhesive film, from being in contact with a corrosive gas particularly such as oxygen, it becomes unnecessary to form Au film on the Ni film by electroless replacement plating which Au film was provided for preventing the oxidation of the Ni film, and at the same time it becomes unnecessary to locally coat only the Au film with flux by screen-printing through a printing mask and a squeegee.

As regards the methods of forming the adhesive film 3, one of the methods is to use DOOCOAT (transliteration) which is the name of the product produced by SANWA RESEARCH INSTITUTE Co., Ltd. in Japan, and another method is shown in JP-A-6-152120 in which the adhesive film is formed by use of such a characteristic of an imidazole derivative as to be selectively adsorbed by a metal surface although it is not adsorbed by an insulator film. However, in order to temporarily fix a solder preform large in volume as in the case of the invention, it is necessary to provide adhesive film having a large thickness which is not contemplated in the prior arts. For example, in the cases of using DOOCOAT (transliteration) produced by SANWA RESEARCH INSTITUTE Co., Ltd. as preflux and of the usage disclosed in JP-A-6-152120, it is good for the adhesive film 3 to have a thickness of about 1 µm at the maximum. However, when temporarily fixing a ball 4 having a diameter not less than about 0.1 mm, it is necessary for the adhesive film to have a thickness of at least 3 µm and preferably not less than about 5 µm. Thus, in the invention, in order to provide the adhesive film having this large thickness, there is adopted a method selected from the following means:

(1) prolonging a period of time of forming the adhesive film 3 at least 5 times (, that is, at least 5 minutes) as long as a conventional period of time;
(2) raising a treatment temperature up to 40° C. or more to thereby form the adhesive film thick in thickness; and
(3) performing the adhesive film-forming step S17 by use of a solution of an imidazole derivative having a chemical structure or composition different from that of the imidazole derivative used in the preflux production.

In the above case (3) are preferred the following chemical structures: 1,3-benzimidazole having at 2-position a substituent which is one selected from the group consisting of (a) a substituent having polyether bond such as polyoxyethylene (—(CH2CH20)n-:n=2~20) etc., (b) a substituent having thiol bond such as alkylthiol (R—S—), (c) a substituent having a portion where a salt is formed which consists of first-grade amino group and an organic acid or inorganic acid, (d) alkyl substituent having an organic acid substituent such as alkylphenol or alkyl sulfonic acid etc., and (e) the combination thereof. Further, as regards the composition of the solution of the imidazole derivative used in the invention, a solution is preferred which is provided by mixing 2-alkyl 1, 3-benzimidazole derivative with chelating agent or solubility-accelerating agent. As regards the chelating agent or the solubility-accelerating agent used in the above case, it is preferred to use one prepared by combining any two or more selected from the group consisting of (a) aminocarboxylic acid such as etylenediaminetetraacetic acid, iminodiacetic acid, tryptophan, phenylalanine and etc., (b) salt of aminocarboxylic acid and any one of alkaline metal, ammonium, copper and nickel, (c) aminosulfonic acid such as taurine, (d) salt containing chloride ion such as ammonium chloride etc. The preferred concentration of the chelalting agent or the solubility-accelerating agent varies in dependence on adhesive film-forming conditions (such as period of time and temperature) and intended film thickness. For example, in a case of the salt containing chloride ions, good results are often obtained when the concentration of the chloride iron in the solution is adjusted to become in the level of 3 to 200 ppm.

After forming the adhesive film by use of the DOOCOAT which is one kind of the imidazole derivatives, solder balls are supplied and located onto the connection pads 2 each provided with the adhesive film 3. In the first embodiment of this supplying method, there is used, as shown in FIG. 2B, a method comprising the step of locating a ball-aligning mask 5 above the wafer 1, and moving the solder balls 4 on the ball-aligning mask 5 through a squeegee 6 so that one of the solder balls 4 may be located on each of the connection pads each provided with the adhesive film 3. The cross section of this state is shown in FIG. 3. In FIG. 3, the adhesive film is formed on the Ni film 22, and it is noted that no excessive portion regarding the adhesive film 3 is formed because Cu or Al conductor 11 connected thereto is protected by an insulator film 10.

Then, as shown in FIG. 2C, by downwardly applying pressure to the solder balls 4 through a pressing plate 7 so that each of the solder balls may become in pressure contact with the adhesive film, each of the solder balls is temporarily fixed onto the adhesive film 3. Then, the aligning mask 5 is removed as shown in FIG. 2D, flux such as, for example, liquid flux being sprayed onto the solder balls through a flux-applying device 9 so that the solder balls may be coated with the flux as shown in FIG. 2E, and the reflow of the solder balls is performed, as shown in FIG. 2F, in a $N_2$ furnace so that the solder balls 4 may be metal-bonded to Ni or Cu of the connection pad, whereby the solder bumps 19 are formed. After that, as occasion demands, the residue of the flux is removed by washing it as shown in FIG. 2G. In this case, by adjusting the chemical composition of the adhesive film 13 so that it may have flux characteristic, it is possible to omit the flux-applying step. The adhesive film 13 having the flux characteristic may have, for example, the following chemical structure and/or composition: (1) the chemical structure of 2-position-substituted 1, 3-benzimidazole having at 2-position substituent including a portion where a salt is formed which consists of first-grade amino group and an organic acid or inorganic acid, and (2) a composition including halogen ion, particularly chloride iron, with an eliminatable shape. By using the adhesive film 13 containing these chemical structure and/or composition, oxide film caused on the surface of each of the solder balls can be removed because of the flux characteristic of the adhesive film itself, whereby the flux-applying step can be omitted. As regards the solder balls, lead-free solder (such as Sn—Ag—Bi base solder and etc.) may be used.

By the above steps, a wafer with the bumps, that is, a electronic part with the bumps is completed. Naturally, before the completed wafer with the bumps is mounted to another electronic part such as, for example, a substrate, the wafer is cut to unit chips, and a protective film may be formed, as occasion demands, on the surface in which the bumps are formed.

In a case where the metal conductor 11 is made of Cu and is provided with a sufficiently large thickness (, for example, 10 µm or more), the metal conductor does not disappear even if it is eroded by the solder, and it becomes possible to omit the forming of the Ni film 22 and to produce the metal conductor itself integrally with the pads 2, onto each of which pads 2 the adhesive film 3 may be formed directly.

Figure 4A:
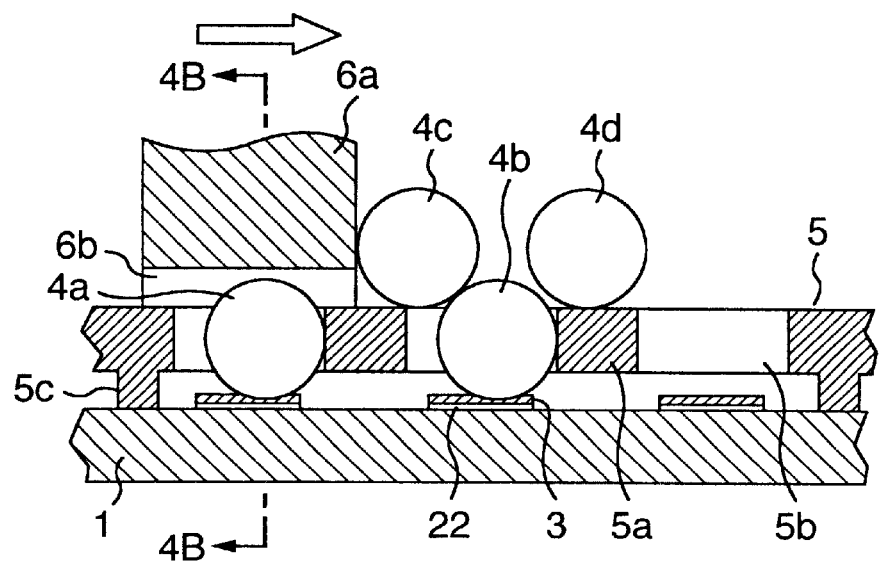
FIGS. 4A and 4B are drawings for explaining the first embodiment (solder ball-printing) of aligning and supplying onto the adhesive film the solder balls relating to the invention.
Figure 4B:
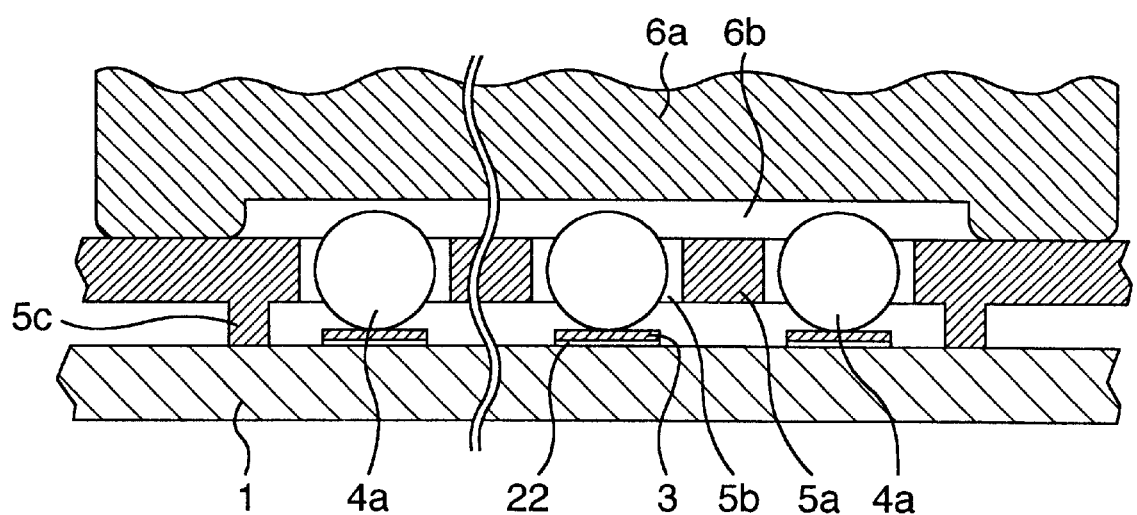

Next, the first embodiment for supplying the solder balls onto the connection pads 2 on each of which the adhesive film 3 relating to the invention is formed is explained while referring to FIGS. 4A and 4B. In FIGS. 4A and 4B is shown in detail the aligning of the solder balls 4 by use of the aligning mask S. On the wafer 1 is previously formed the Ni film 22 and the adhesive film 3, and the aligning mask 5 is located so that the location of the aligning mask 5 may properly correspond to that of the wafer. In the aligning mask 5, there are provided non-opening portions 5a, opening portions 5b each having such an opening size as the solder balls can pass through the opening portions, and protrusions 5c for supporting the non-opening portions 5a so that the non-opening portions may not contact with the adhesive film 3.

As shown in FIGS. 4A and 4B, since each of the protrusions 5c is narrow in width and is spaced sufficiently apart from the adhesive film 3, the aligning mask 5 is prevented from contacting with the adhesive film 3 even during the sliding of the aligning mask 4 which sliding is performed for locating the aligning mask 4 in place, whereby there occurs no fear that the adhesive film 3 is transferred and adhered to the aligning mask 5. Of course, the height of each of the protrusions 5c is made to be sufficiently larger than the total value of the thickness of the Ni film 22, the thickness of the adhesive film 3 and the foreseen deflection amount of the non-opening portion 5a.

The thickness of the non-opening portions 5a is adjusted in such a degree as the strength of the whole of the aligning mask 5 is maintained and as the total value of the height of the protrusion 5c and the thickness of the non-opening portion 5a is in the same level as the diameter of the solder balls 4 and preferably is about 0.9 times the diameter of the solder balls 4. In a case where the total value of the thickness of the non-opening portion 5a and the height of the protrusion 5c is extremely larger than the diameter of the solder balls 4, a plurality of solder balls 4 come to remain in some of the opening portions 5b, that is, the excessiveness of the balls 4 occurs. In another case where this total value is extremely smaller than the diameter of the solder balls, non-aligned solder balls 4c come to apply force to the aligned balls 4b, there occurs such a fear as the solder balls come to be peeled off when the adhesion of the adhesive film is not sufficient, with the result that the failure of supplying the solder balls occurs. The total value of the thickness of the non-opening portion 5a and the height of the protrusion 5c may be in the same level as the diameter of the solder balls 4, however, in this case, since the diameter of each of the opening portions 5b can not help being larger than the diameter of the solder balls 4, a non-aligned solder ball 4c comes to fall by a considerable amount in a clearances defined between the aligned ball and the opening portion 5b. Thus, when this total value is about 0.9 times the diameter of the balls, the aligning state of the solder balls becomes good.

The diameter of the opening portion 5b needs to be in such a large value as the solder ball can readily pass it, and at the same time needs to be not more than the predetermined upper limit thereof so that a superfluous ball may not contact with the adhesive film 3. The appropriate range thereof varies in dependence on the diameter of the balls actually used. However, in a case where the diameter of the solder balls 4 is in the range of about 200 to about 500 $\mu$m, the diameter of the opening portions 5b is selected preferably in a range from 1.15 times the diameter of the solder balls to the sum of the diameter of the solder balls and 50 $\mu$m. In a case where solder balls each having a diameter less than the above range are used, the diameter of the opening portions 5b is selected in a range from about 1.1 times the diameter of the solder balls to about 1.5 times the diameter thereof. However, the smaller the diameter of the solder balls becomes, the more the difficulty of surely supplying the balls through the mask increases and the more the fear that the mask catches the supplied solder balls when removing the mask increases.

The ball-aligning squeegee 6 is provided with both of a main portion 6a for pushing the solder balls 4 and sliding portions 6b for preventing the main portion 6a from contacting with an aligning mask region, in which the opening portions 5b are arranged two-dimensionally, and from contacting with the solder balls 4a, 4b etc. having been already aligned. Namely, each of the sliding portions 6b is formed to protrude from the one side of the main portion 6a toward the wafer 1 in a direction vertical to the sliding direction shown by the arrow in FIG. 4A (, i.e., in the upper-and-down direction of the paper of FIG. 4A). The protrusion height of the sliding portions 6b is set to be less than about the half of the diameter of the solder balls but more than an amount by which each of the balls 4a, 4b having been aligned is protruded from the aligning mask 5. For example, when the diameter of the solder balls is about 300 $\mu$m, the protrusion height of the sliding portions 6b is preferably about 130 $\mu$m, and when the diameter thereof is about 200 $\mu$m, the protrusion height thereof is preferably about 80 $\mu$m. In a case where the protrusion height of the sliding portions 6b is not less than the half of the diameter of the solder balls 4 but less than about the diameter thereof, the ball-aligning squeegee 6 comes to push the solder balls 4 at the edge of the main portion 6a (, i.e., the corner portion defined by both of the lower face and vertical face of the main portion 6a), with the result that the solder balls 4 are apt to be readily scratched. Further, in this unfavorable case, when pushing the non-aligned balls 4c, the edge of the main portion 6a applies downward force to the non-aligned solder ball 4c, so that there occur such a fear as the non-aligned balls 4b are damaged and/or as an excessive, non-aligned solder ball 4c is forced into the opening 5b with the result that a plurality of solder balls 4 are forced into one of the opening portions 5b to thereby cause the failure of the aligning. Thus, the protrusion height of the sliding portion 6b needs to be less than about the half of the diameter of the solder balls 4 but more than the value by which each of the balls 4a, 4b having been already aligned is protruded from the aligning mask 5. The aligning mask 5 may be made of Fe—Ni—based alloy strip, and the aligning squeegee may be made of hardened carbon steel. Further, it is preferred that a rounded portion is formed at each terminal corner of the sliding portions 6b so that the aligning squeegee may smoothly slide on the aligning mask.

In the production process of producing the solder bumps, it becomes possible, according to the selection of the adhesion of the adhesive film and/or the weight of the solder ball itself, to bring about the temporarily fixed state of the solder balls 4 only by aligning each of the solder balls 4 onto the adhesive film 3, so that it becomes possible to also omit the pressing step shown in FIG. 2C. In this case, the production steps are simplified, and it becomes easy to perform the production of the bumps.

Figure 5A:
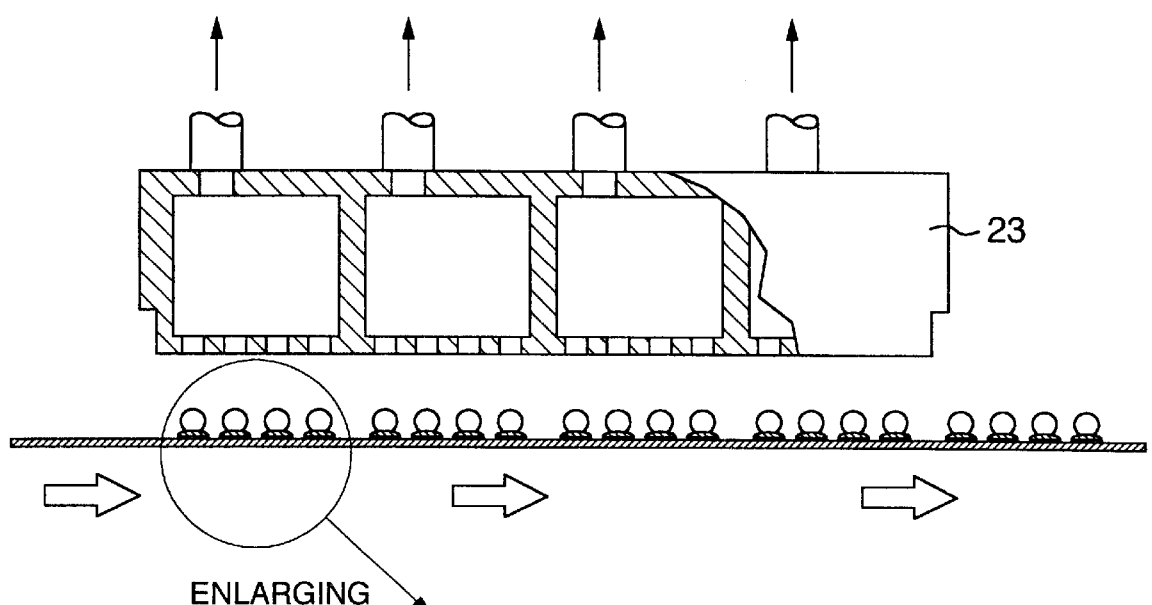
FIGS. 5A and 5B are drawings for explaining the second embodiment (adsorbing mask) of aligning and supplying onto the adhesive film the solder balls relating to the invention.
Figure 5B:
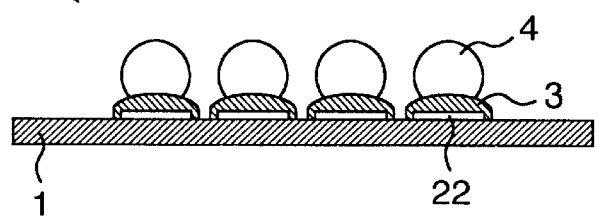

Next, a second embodiment of the invention regarding the supplying of the solder balls onto the connection pads 2 each provided with the adhesive film 3 is explained below while referring to FIGS. 5A and 5B. In the second embodiment, as shown in FIGS. 5A and 5B, the solder balls are aligned, adsorbed and transferred by a vacuum adsorbing mask 23 and are then shifted onto the wafer 1. Alternatively, before the solder balls 4 are mounted onto the wafer 1, it is possible, by use of the aligning mask 5 and the ball-aligning squeegee 6 both located above a plate for alignment, to previously align the solder balls in the aligning mask 5. In this case, the solder ball-aligning step can be independently performed in parallel with the transferring steps of adsorbing and transferring the solder balls 4 from the aligning mask 6 by use of the vacuum adsorbing mask 23 and shifting the solder balls onto the wafer 1, whereby there occurs such an advantage as a total period of time necessary for the production can be shortened. Further, when adsorbing the aligned solder balls 4 by the vacuum adsorbing mask 23, the aligning mask 5 may be also adsorbed. By adsorbing the aligning mask 5, it becomes possible to mount each of the solder balls 4 onto the adhesive film 3 without causing any deviation of location during a period in which the aligned solder balls 4 have been shifted onto the wafer 1.

Further, as a modification example of the embodiment shown in FIG. 5, the solder balls 4 having been aligned and adsorbed onto the vacuum adsorbing mask 23 may be immersed into flux and thereafter may be shifted onto the wafer, which brings about such a merit as to simplify the flux-applying step shown in FIG. 2E.

Then, an embodiment of a method of mounting a semiconductor package (semiconductor device) with the bumps produced in accordance with the above-explained embodiments is described while referring to FIG. 6. Namely, after the bumps 19 have been formed on the wafer 1, the wafer is cut into individual chips, the kind thereof and the production number thereof etc. being applied to each of the chips, a protection film being formed as occasion demands, whereby the semi-conductor package 17, (i.e., semiconductor device) is produced which is an electronic part. On the other hand, on a substrate 15 which is another electronic part to be mounted, connection pads are already formed and are coated with flux 12.

Figure 6A:
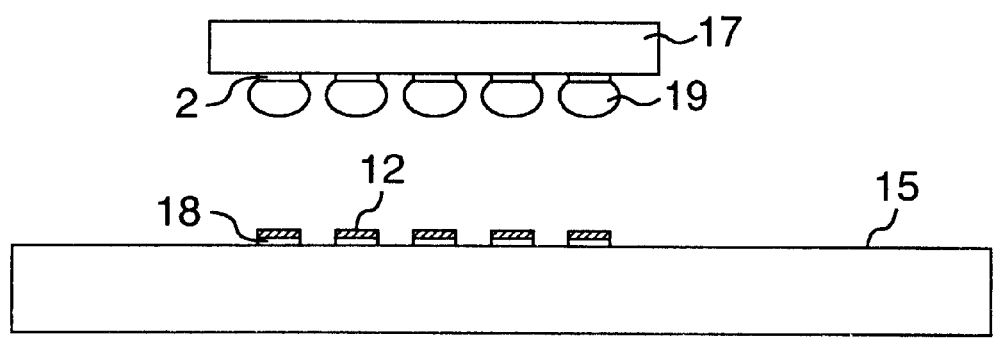
FIGS. 6A and 6B are drawings for explaining the first embodiment of mounting the semiconductor device produced in accordance with the solder bump-forming process relating to the invention.
Figure 6B:
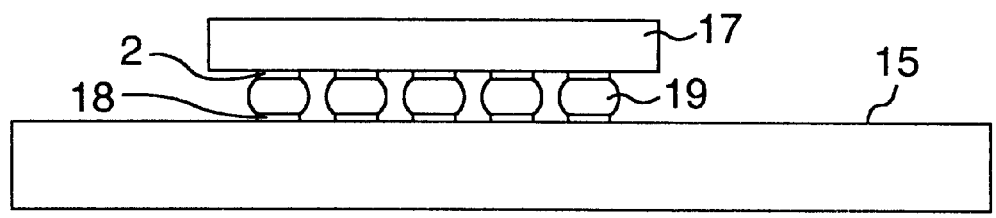

Thus, by locating the solder bumps 19, which are formed on the semiconductor package (semiconductor device) 17, onto the connection pads 18 coated with flux 12 which are formed on the substrate 15 as shown in FIG. 6A, and then by heating them, both of the semiconductor package 17 and the substrate 15 are connected to each other as shown in FIG. 6B.

Figure 7A:
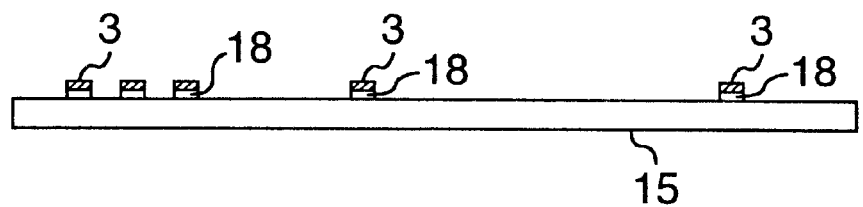
FIGS. 7A to 7D are drawings for explaining the second embodiment of mounting the semiconductor device produced in accordance with the solder bump-forming process relating to the invention.
Figure 7B:
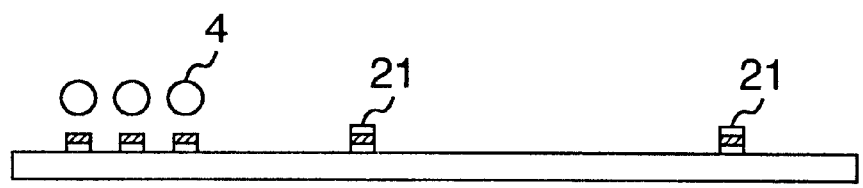
Figure 7C:
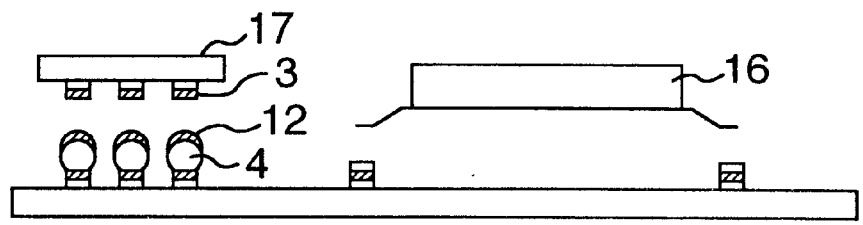
Figure 7D:
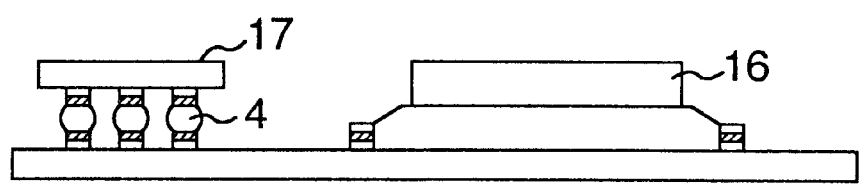

Next, an embodiment of forming solder bumps relating to the invention at the side of the substrate 15 is described while referring to FIGS. 7A to 7D. Namely, after forming a conductor pattern of the substrate, adhesive film 3 is formed on each of connection pads 18, as shown in FIG. 7A, by use of the same method as in FIG. 1. This method of forming the adhesive film 3 is similar to the method of forming the adhesive film on the wafer 1, that is, by replacing the wafer 1 relating to each of the above-described steps by the substrate 1, this method is provided. Further, steps of supplying each of the solder balls 4 onto the adhesive film 3 and coating the solder balls 4 with flux can be performed similarly to the case of the method relating to the wafer 1, as shown in FIG. 7B. For example, in a state in which no electronic part is mounted on the substrate 15, the solder balls 4 may be mounted by the method shown in FIG. 2. Further, in another state where other electronic parts had been already mounted with the result that the aligning mask 5 interferes with the other electronic parts, it may be adopted to use the mounting method shown in FIGS. 5A and 5B in which the adsorbed solder balls is transferred and shifted. After thus locating the solder balls 4 onto the substrate 15, flux 12 or solder paste 21 is fed, as occasion demands, to the substrate 15 or to the electronic part such as the semiconductor chip 17 and the semiconductor package 16 by a method not shown in the drawings, and then the semiconductor chip 17 and the semiconductor package 16 are mounted at the predetermined locations on the substrate 15 through adhesive films 3 used as a temporarily fixing agent. After that, by making them pass a reflow furnace (not shown in the drawings) to thereby heat them, the connection pads 18 of the substrate 15 are metal-bonded to the pads of the electronic parts 16, 17. Then, the residue of the flux 12 is removed by rinsing as occasion requires.

Next, the handling of the adhesive film 3 used in each of the embodiments is described below. The adhesive film 3 used in the methods embodying the invention loses the adhesion due to the drying thereof caused with the lapse of time or caused by heating etc. Thus, within a period of time in which the formed adhesive films do not become dry, it is necessary to locate each of the solder balls 4 on the adhesive film. Once the solder balls are located, the solder balls 4 are fixed and there occurs, even if the adhesive film becomes dry, no fear that the solder balls 4 are peeled off during the transportation thereof and etc. Further, in a case where, after the forming of the adhesive film, a considerable period of time lapses prior to locating the solder balls 4, the adhesive film is once made to have a drying state, and thereafter it is coated with alcohol etc. to thereby be softened so that the adhesion may be regained (, that is, after performing the regenerating treatment for regaining the adhesion), whereby the solder balls 4 can be located properly.

Further, the connection member used in the invention is not limited to the solder balls but may be formed to be preforms each having a cylindrical shape or the shape of a prism.

According to the embodiments described above, since it is possible to supply solder balls each having a necessary volume without being limited regarding the area of each of the electrode pads, the volume of each of the solder balls can be freely designed. For example, by supplying only one solder ball having a diameter of about 150 $\mu$m onto the pad having a diameter of about 300 $\mu$m, the height of the bump can be adjusted to be about 30 $\mu$m, or the height of the bump can be also adjusted to be about 300 $\mu$m by supplying a solder ball having a diameter of about 400 $\mu$m onto the same pad as described above.

According to the invention, since each of the solder balls can be surely located onto the previously formed adhesive film, there is brought about such an advantage as each of the formed solder bumps can be made to have uniform volume.

Further, according to the invention, since there occur no problems caused in the prior arts such as failure in adhering the solder balls and the losing of the solder balls due to excessive sweeping operation, it becomes possible to surely form the solder bumps.

What is claimed is:

1. A method of producing an electronic part with bumps comprising the steps of:
   selectively forming an adhesive film on each of a plurality of pad portions provided on said electronic part;
   aligning and supplying a bonding member onto said adhesive film formed on each of said pad portions; and
   bonding each of said bonding members, which are supplied in the bonding member-aligning-and-supplying step, to each of said pad portions by melting said bonding member so that each of said bumps is formed of said bonding member and so that each of said bumps is bonded to each of said pad portions,
   further comprising, in a case where adhesion of said adhesive films has deteriorated due to an elapse of time after forming the adhesive film, a step of regenerating said adhesive film so that said adhesive film regains the adhesion.

2. A method of producing an electronic part with bumps, comprising the steps of:

selectively forming adhesive film on each of a plurality of pad portions provided on said electronic part, which forming is performed by immersing the electronic part in a fluid containing imidazole derivative which is adsorbed on metallic portions and which is not adsorbed on portions other than the metallic portions;

aligning and supplying a bonding member onto said adhesive film formed on each of said pad portions; and bonding each of said bonding members, which are supplied in the bonding member-aligning-and-supplying step, to each of said pad portions by melting said bonding member so that each of said bumps is formed of said bonding member and so that each of said bumps is bonded to each of said pad portions, further comprising, in a case where adhesion of said adhesive films has deteriorated due to an elapse of time after forming the adhesive film, a step of regenerating said adhesive film so that said adhesive film regains the adhesion.

3. A method of producing an electronic part with bumps, comprising the steps of:

selectively forming adhesive film on each of a plurality of pad portions provided on said electronic part, which forming is performed by immersing the electronic part in a fluid containing imidazole derivative which is adsorbed on metallic portions and which is not adsorbed on portions other than the metallic portions;

aligning and supplying a bonding member onto said adhesive film formed on each of said pad portions, which aligning and supplying are performed by use of both of an aligning mask having opening portions capable of aligning and supplying said bonding members and an aligning squeegee capable of moving the bonding members into said opening portions; and bonding each of said bonding members, which are supplied in the bonding member-aligning-and-supplying step, to each of said pad portions by melting said bonding member so that each of said bumps is formed of said bonding-member and so that each of said bumps is bonded to each of said pad portions, further comprising, in a case where adhesion of said adhesive films has deteriorated due to an elapse of time after forming the adhesive film, a step of regenerating said adhesive film so that said adhesive film regains the adhesion.

\* \* \* \* \*